United States Patent [19]

Ju et al.

[11] Patent Number: 5,273,205
[45] Date of Patent: Dec. 28, 1993

[54] METHOD AND APPARATUS FOR SILICON FUSION BONDING OF SILICON SUBSTRATES USING WET OXYGEN ATMOSPHERE

[75] Inventors: Byeong K. Ju; Myung H. Oh; Kwang N. Kang, all of Seoul, Rep. of Korea

[73] Assignee: Korea Institute of Science and Technology, Seoul, Rep. of Korea

[21] Appl. No.: 977,460

[22] Filed: Nov. 17, 1992

[30] Foreign Application Priority Data

Nov. 21, 1991 [KR] Rep. of Korea ............... 20836/1991

[51] Int. Cl.$^5$ ............................................. H01C 21/461
[52] U.S. Cl. ................................... 228/193; 228/219; 437/247
[58] Field of Search ............... 228/121, 193, 196, 219; 437/247, 248, 915

[56] References Cited

U.S. PATENT DOCUMENTS 4,700,466 10/1987 Nakagawa et al. ............... 437/247

Primary Examiner—Samuel M. Heinrich
Attorney, Agent, or Firm—Lowe, Price, LeBlanc & Becker

[57] ABSTRACT

A silicon fusion bonding method and apparatus for bonding silicon substrates in wet oxygen atmosphere. The method comprises a stabilizing step of the silicon substrates, which has been processed in a pre-process, in the wet oxygen atmosphere, a primarily bonding step of the silicon substrates to each other and a heat-treating step of the silicon substrates at a high temperature in the wet oxygen atmosphere in order to remove micro-gaps from a junction interface by virtue of filling-up effect of micro-gaps by interfacial oxide growing. The present apparatus includes a hollow quartz tub having a stabilization part and a heat-treating part, a flask for providing the wet oxygen atmosphere for the quartz tub, a heater for heating the heat-treating part of the quartz tub and a movable carrier for moving between the stabilization and heat-treating parts of the quartz tub as carrying thereon the silicon substrates in such a manner that the silicon substrates are spaced apart from each other with a quartz spacer interposed therebetween when they are stabilized and come into contact with each other by removing of the quartz spacer when they are heat-treated.

3 Claims, 5 Drawing Sheets

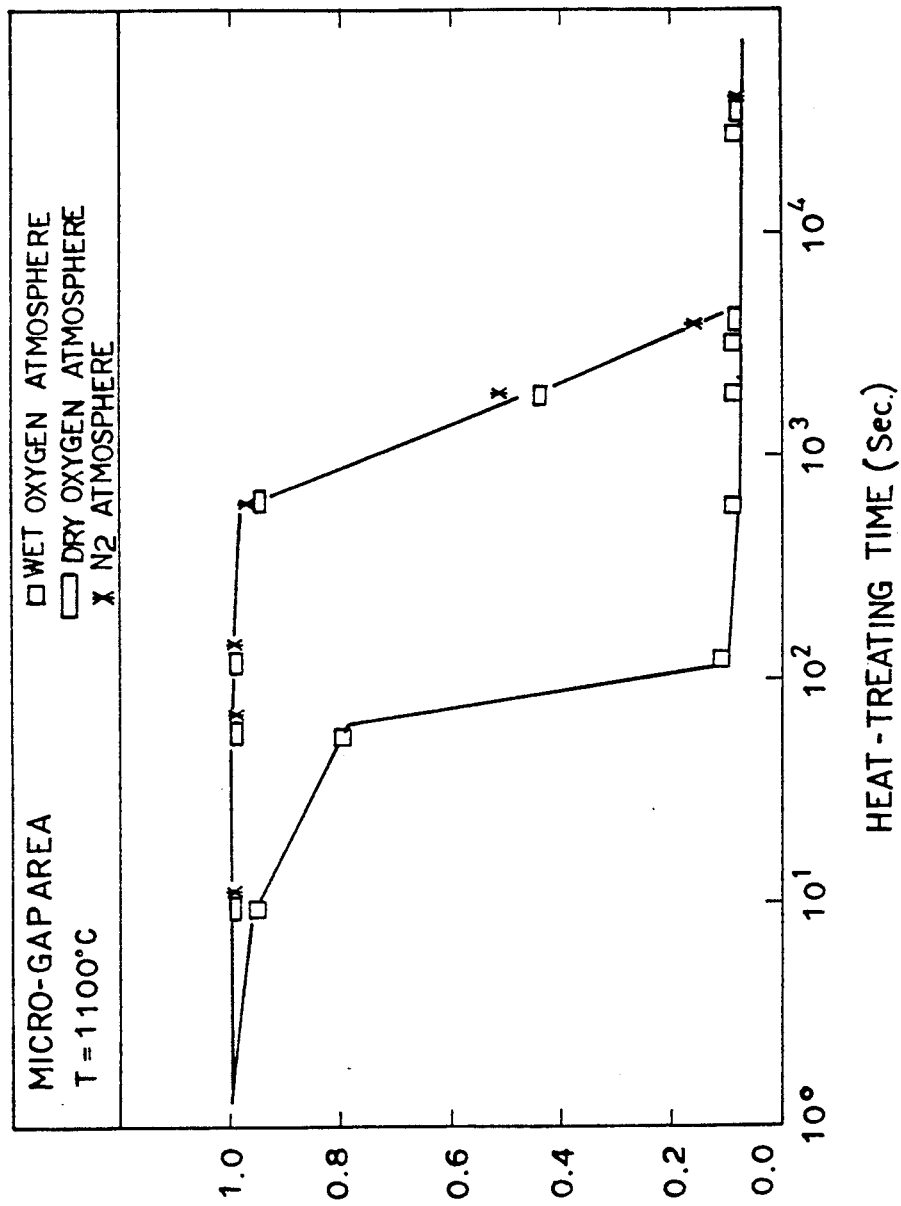

METHOD AND APPARATUS FOR SILICON FUSION BONDING OF SILICON SUBSTRATES USING WET OXYGEN ATMOSPHERE

BACKGROUND OF THE INVENTION

1. Field of the Invention

The present invention relates in general to an improvement of silicon fusion bonding of silicon substrates for preparation of silicon structure, and more particularly to a method and apparatus for silicon fusion bonding of the silicon substrates which fills up micro-gaps of a junction interface between the silicon substrates and improves junction strength of the junction interface by growing of wet-type oxide layers at the micro-gaps of the junction interface through a stabilizing process for adsorbing a great quantity of oxidant and a high temperature heat-treating process in the presence of oxidant after completion of the pre-process of silicon substrates.

2. Description of the Prior Art

In recent years, there has been proposed silicon fusion bonding method for forming silicon on insulator (SOI) structure used for a three dimensional semiconductor element or micro-mechanical structure used for a silicon sensor and actively studied for improving such a silicon fusion bonding method for preparation of the silicon structures.

A conventional silicon fusion bonding method for junction or bonding of the silicon substrates will be described as follows.

First, the silicon substrates to be bonded to each other are washed according to a standard wafer washing such as RCA washing in order to clean their surfaces and immersed in an alkaline solution having OH ions, thereby causing a hydrophilic layer having a great quantity of OH ions to be formed thereon. The result silicon substrates or the silicon wafers having the hydrophilic layer are then dried and faced to each other such that their surfaces face to each other and this permits the silicon wafers to be primarily bonded to each other by OH ion bond, so called hydrogen bond.

Thereafter, the bonded wafers which have been subjected to the aforementioned processes are heat-treated at a high temperature higher than about 1,000° C. for about 60 minutes so as to intend to improve the junction strength of the junction interface of the result wafers and to remove the non-bonded parts from the junction interface.

In the aforementioned known silicon fusion bonding method, it is noted that the junction strength of the silicon wafers when they are primarily bonded to each other by the OH ion bond is about 5 to 10 kg/cm$^2$, which is considered as relatively lower strength, and there are occasionally non-bonded parts at the junction interface of the result bonded wafers. However, these problems, or the relatively lower junction strength and presence of non-bonded parts, can be conventionally overcome by the continued heat-treating process. That is, the heat-treating process carried out at the high temperature results in elastic/plastic deformation of the silicon substrates at the junction interface and/or solid state diffusion of silicon or oxygen atoms and this makes the initial Si-OH-OH-Si type junction be transformed to Si-Si type junction and, as a result, improves the junction strength of the junction interface to at least 150 kg/cm$^2$ and removes the non-bonded parts from the junction interface.

However, in order to cause the elastic/plastic deformation of the silicon substrates and the solid state diffusion of the silicon or oxygen atoms, the primarily bonded silicon wafers are necessarily subjected to the heat-treating process carried out at the high temperature higher than 1,000° C. for at least 60 minutes and, in this regard, the doping profile previously formed in the silicon wafer and/or on the silicon wafer surface is deformed. As a result, the disadvantage of the known silicon fusion bonding is resided in that the deformation of the doping profile causes a process error to occur in the continued preparation processes, for example, thinning process using electrochemical etching stop for providing silicon membrane structure for the silicon wafers.

SUMMARY OF THE INVENTION

It is, therefore, an object of the present invention to provide a method and apparatus for silicon fusion bonding of silicon substrates in which the above disadvantage can be overcome and the silicon substrates having an OH$^-$ ion adsorbing layer respectively are stabilized in the presence of oxidant at the room temperature in order to facilitate the primary bond or hydrogen bond of the silicon substrates to each other and heat-treated in the presence of a great quantity of oxidant at a high temperature in order to cause what is called "filling-up effect of micro-gap by interfacial oxide growing" wherein wet-type oxide layer is grown at the micro-gaps of the non-bonded parts of the junction interface between the silicon substrates, thereby reducing the heat-treating time required for removing the micro-gaps from the junction interface.

As well known to those skilled in the art, the conventional technique for removing the micro-gaps of the junction interface of the silicon substrates in the known silicon fusion bonding method comprises heat-treating the primarily bonded silicon substrates at a high temperature higher than 1,000° C. in order to cause thermal oxidation to occur on the silicon substrates by virtue of oxidants remaining in the micro-gaps of the junction interface and OH$^-$ ions on the silicon substrates and, in this respect, results in gas pumping action. In result, there occurs partial vacuum state in the micro-gaps and this causes the elastic/plastic deformation of the silicon substrates and solid state diffusion of silicon or oxygen atoms, thereby removing the micro-gaps of the junction interface and improving the junction strength. In this respect, disadvantage of the known silicon fusion bonding method for silicon substrates is resided in that removing of the micro-gaps and improvement of junction strength of the junction interface are not influenced by the heat-treating atmosphere but by the heat-treating temperature, higher than about 1,000° C., and the heat-treating time, more than 60 minutes.

However, during repeated silicon fusion bondings for preparation of silicon sensors, such as silicon pressure sensors and silicon acceleration sensors, the present inventors appreciated that unstable junction of the silicon substrates was almost caused by a plurality of micro-gaps respectively having a micro-width less than 0.1 μm, the heat-treating atmosphere was an important parameter for removing such micro-gaps by high temperature heat-treating in a short time and wet oxygen gas O$_2$ was the most appropriate atmospheric gas which can cause the aforementioned desired heat-treating atmosphere.

In accordance, the noble silicon fusion bonding of this invention includes high temperature heat-treating carried out in the wet oxygen atmosphere. Here, the wet oxygen gas $O_2$, the oxidant, has an intrinsic characteristic of a high solubility in the oxide layer which is about 600 times as high as those of the conventional atmospheric gases, for example, dry oxygen gas $O_2$ and nitrogen gas $N_2$, used in known silicon fusion bonding. In this respect, the wet oxygen gas is more easily fed, at the initial step of the heat-treating, to the junction interface between the silicon oxide and the silicon substrate through micro-channels formed in the junction interface of the silicon substrates and makes interfacial oxide layer to be grown. This interfacial oxide layer growing causes the micro-gaps to be filled up in a short time and the junction strength to be improved.

In an embodiment, the present invention provides a silicon fusion bonding method for silicon substrates which comprises stabilizing, in the wet oxygen atmosphere, the silicon substrates to be bonded to each other which have been processed in a serial pre-process of RCA washing→$OH^-$ ion adsorbing layer forming→washing and drying, in order to permit a great quantity of oxidant to be adsorbed by the silicon substrates and dissolved on the silicon substrate surfaces or the surface oxide layer, facing the result silicon substrates or the silicon wafers to each other in order to cause primary bond of the silicon substrates to each other owing to $OH^-$ ion bond, what is called hydrogen bond, and heat-treating in the wet oxygen atmosphere the primarily bonded silicon substrates in order to cause interfacial oxide layer growing which fills up the micro-gaps of the junction interface in a short time as well as improvement of junction strength.

Here, the heat-treating step is carried out at about 1,000°–1,100° C. for 2–10 minutes.

In order to efficiently carry out the above silicon fusion bonding method, the present invention provides silicon fusion bonding apparatus comprising: a hollow quartz tub for forming a casing of the apparatus, said hollow quartz tub having a stabilization part and a heat-treating part; a cap being mounted on an end of the hollow quartz tub, said cap having a gas exhaust pipe permitting oxidant atmospheric gas to be exhausted from the inside of said quartz tub to the outside therethrough; a flask for providing said oxidant atmospheric gas for said quartz tub; a gas inlet pipe for permitting said oxidant atmospheric gas to be fed from said flask to said quartz tub, said gas inlet pipe being connected between said flask and said quartz tub; a heater for heating said heat-treating part of said quartz tub in order to carry out heat-treating of said silicon substrates in the presence of said oxidant atmospheric gas; a movable carrier for moving between said stabilization and heat-treating parts of the quartz tub as carrying thereon said silicon substrates in such a manner that said silicon substrates are spaced apart from each other with a quartz spacer interposed therebetween when they are stabilized and come into contact with each other by removing of said quartz spacer when they are heat-treated.

BRIEF DESCRIPTION OF THE DRAWINGS

The above and other objects, features and other advantages of the present invention will be more clearly understood from the following detailed description taken in conjunction with the accompanying drawings, in which:

FIGS. 2A and 2B are enlarged views of a wafer carrier of the silicon fusion bonding apparatus of FIG. 1, respectively, in which:

FIG. 2A shows a wafer separation state wherein silicon wafers are separated from each other; and FIG. 2B shows a wafer contact state wherein silicon wafers come into contact with each other;

FIGS. 3A and 3B show ultrasonic images of a junction interface of the silicon wafers, respectively, in which:

FIG. 3A shows the junction interface after completion of stabilizing process at the room temperature; and FIG. 3B shows the junction interface after completion of heat-treating process;

FIG. 4 is a graph of variation of micro-gaps as a function of heat-treating atmospheric gases, wet oxygen gas, dry oxygen gas and nitrogen gas; and FIGS. 5A and 5B are graphs of variation of junction strength as a function of the heat-treating atmosphere and heating-treating time, respectively, in which:

FIG. 5A is a graph of micro-gaps of the junction interface, the A section of FIG. 3A; and FIG. 5B is a graph of stable junction part of the junction interface, the B section of FIG. 3A.

DESCRIPTION OF THE PREFERRED EMBODIMENTS

Figure 1:
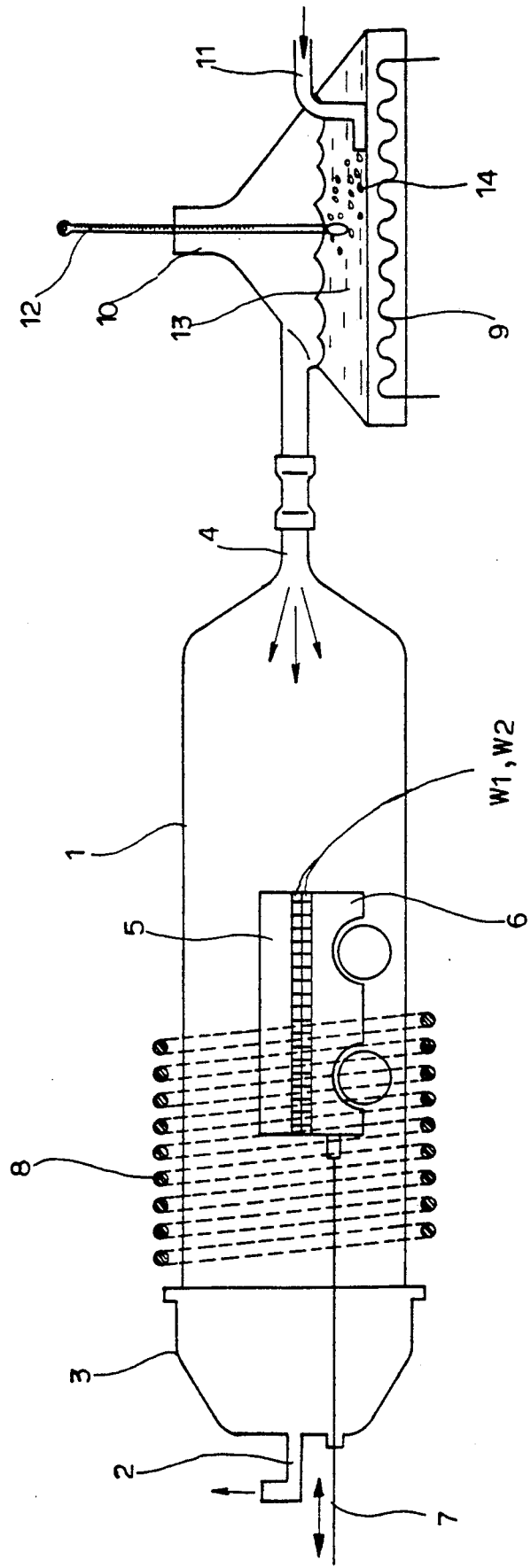
FIG. 1 is a front view showing total construction of silicon fusion bonding apparatus in accordance with the present invention.

With reference to FIG. 1 showing a preferred embodiment of silicon fusion bonding apparatus according to this invention, the apparatus has a cap 3 which is mounted on an end of a horizontal cylindrical quartz tub 1 and includes a gas exhaust port 2 through which the atmospheric gas is exhausted from the inside of the quartz tub 1 to the outside. The cylindrical quartz tub 1 is also connected to a gas inlet pipe 4, through which the atmospheric gas is introduced into the inside of the tub 1, at the other end thereof and provides inner space for enclosing a wafer carrier 6 and permitting the carrier 6 to horizontally reciprocate under the control of a reciprocating control lever 7. This wafer carrier 6 carries thereon a pair of silicon wafers, or silicon substrates $W_1$ and $W_2$, to be bonded to each other with a weight 5 laid on the silicon wafers. A heater 8, preferably coiled heater, is provided at the one end of the quartz tub 1 such as by surrounding the outer circumferential surface of the tub 1, while a flask 10 provided with a bottom heater 9 is connected to the gas inlet pipe 4 of the quartz tub 1.

In the drawing, FIG. 1, the reference numerals 11, 12, 13 and 14 denotes a gas injection pipe, a thermometer, boiling nonelectrolytic water at a temperature higher than 95° C. and bubbles, respectively.

Figure 2A:
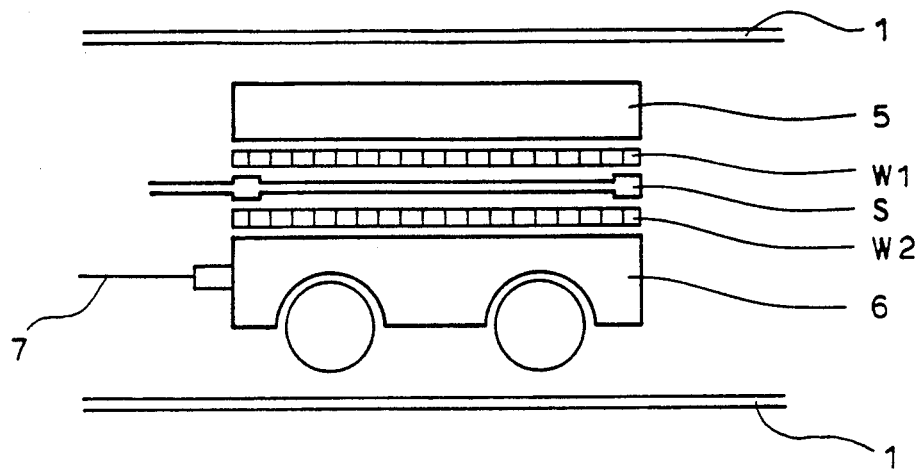
Figure 2B:
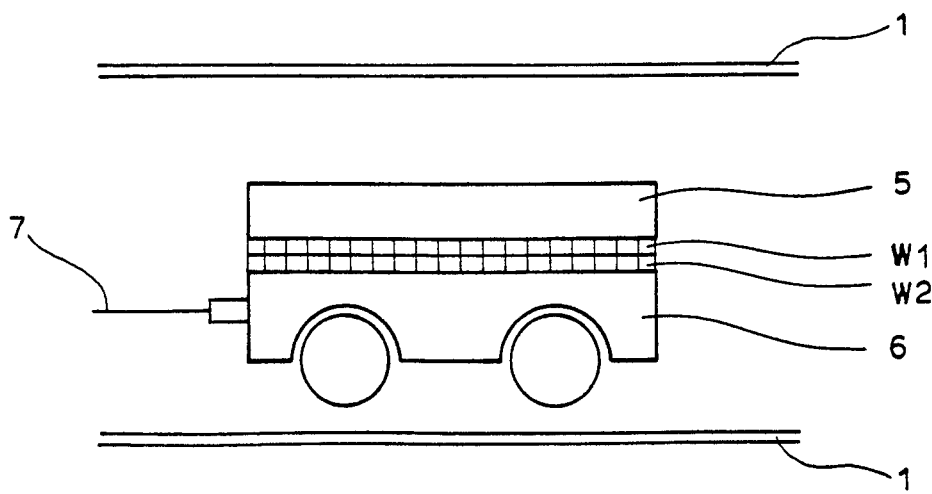

Turning to FIGS. 2A and 2B, respectively showing the wafer carrier 6 in large scale, in order to describe silicon fusion bonding of this invention carried out using the aforementioned silicon fusion bonding apparatus, the two silicon substrates $W_1$ and $W_2$ after completion of pre-process are first stabilized in the presence of oxidant or wet oxygen $O_2$, which is continuously introduced from the flask 10 into the inner space of the quartz tub 1 through the gas inlet pipe 4, under the condition that they are carried by the wafer carrier 6 with provision of a predetermined interval therebetween by interposition of a quartz spacer S therebetween as depicted in FIG. 2A. After completion of the stabilization of the silicon substrates $W_1$ and $W_2$, the quartz spacer S is removed from the carrier 6 in order to permit the silicon substrates $W_1$ and $W_2$ to come into contact with each other as depicted in FIG. 2B. This contact of the silicon substrates $W_1$ and $W_2$ with each other causes hydrogen bond between the $OH^-$ ions remaining on the silicon substrate surfaces to occur and, as a result, primary bond of the silicon substrates $W_1$ and $W_2$ is accomplished in about 5-10 seconds. Here, a plurality of micro-gaps may be presented in the junction interface of the silicon substrates $W_1$ and $W_2$ resulting from the above primary bonding and the junction strength of the junction interface is relatively lower as noted to those skilled in the art.

Upon certifying completion of the primary bonding of the silicon substrates $W_1$ and $W_2$, the reciprocating control lever 7 is manipulated in order to be pulled outwards, thereby moving the carrier 6 to a heating part of the quartz tub 1 on which the heater 8 is provided. At this position, high temperature heat-treating process for the carrier 6 carrying the primarily bonded silicon substrates $W_1$ and $W_2$ is carried out in order to remove the micro-gaps remaining in the junction interface as well as improvement of the junction strength of the junction interface.

Here, the removing of the micro-gaps is accomplished by filling-up of these micro-gaps which is caused by not only the typical elastic/plastic deformation of the silicon substrates and the typical solid state diffusion of silicon atoms but also interfacial oxide layer growing caused by continuous maintenance of the oxidant atmosphere thanking for the wet oxygen $O_2$ which is fed in great quantities from the flask 10 to the inner space of the quartz tub 1. Particularly, the filling-up of micro-gaps by the interfacial oxide layer growing is accomplished in a short time, preferably 2 to 10 minutes, in initial step of the high temperature heat-treating process, thus improving the junction strength of the junction interface together with generation of the filling-up effect of the micro-gaps.

The following example is merely intended to illustrate the present invention in further detail and should be no means be considered to limitative of the scope of the invention.

EXAMPLE

The prepared silicon substrates were n-type and p-type silicon wafers, each having a diameter of 4 inch, a thickness of 525-530 μm and a resistivity of 4.5-5.5 Ωcm and respectively having TIR (total indicator reading) average values, indicating surface smoothness, of 1.435 μm and 1.553 μm.

Each of the prepared silicon substrates was washed in accordance with the standard RCA washing process and immersed in the alkaline solution of 6 parts $H_2O + 1$ part $H_2O_2 + 4$ parts $NH_4OH$ at a temperature of 60° C. for 3 minutes in order to form an $OH^-$ ion adsorbing layer. Thereafter, each of the result silicon substrates having the $OH^-$ ion adsorbing layer was subjected to a serial pre-process of washing→bubbling→spin drying.

The silicon substrates after completion of the above pre-process were carried by the wafer carrier 6 of the silicon fusion bonding apparatus to this invention with provision of a predetermined interval therebetween by interposition of quartz spacer S therebetween, and in turn stabilized at the room temperature in the same atmosphere as a heat-treating process, which was to be carried out later, for 30 seconds. Upon accomplishment of the stabilization of the silicon substrates, the quartz spacers S was removed from the carrier 6 in order to make the silicon substrates to come into contact with each other. In this respect, there occurred hydrogen bond of the $OH^-$ ions remaining on the silicon substrate surfaces and this causes the silicon substrates to be primarily bonded to each other.

This primary bond of the silicon substrates owing to the hydrogen bond of the $OH^-$ ions required about 5-10 seconds. Upon certification of accomplishment of the primary bond, the carrier 6 was moved to the heating part, provided with the heater 8, of the quartz tub 1 wherein the primarily bonded silicon substrates carried by the carrier 6 were in turn heat-treated at a high temperature of 1,100° C. in the same atmosphere as the above stabilization of the silicon substrates.

Here, the atmospheric gas in which both the room temperature stabilization and the high temperature (1,100° C.) heat-treating of the silicon substrates were carried out was wet oxygen gas (generated by bubbling $H_2O$ at 95° C.), dry oxygen gas $O_2$ or nitrogen gas $N_2$ and the heat-treating was carried out as the heat-treating time was varied from 10 seconds to 10 hours.

In accordance with the aforementioned silicon fusion bonding processes, several result silicon structure having the silicon substrates bonded to each other were obtained.

MEASUREMENT

The result silicon structures were then measured in the filling-up effect of the micro-gaps of the junction interface between the bonded silicon substrates and the improvement of the junction strength of the junction interface. The results are described as follows.

Figure 3A:
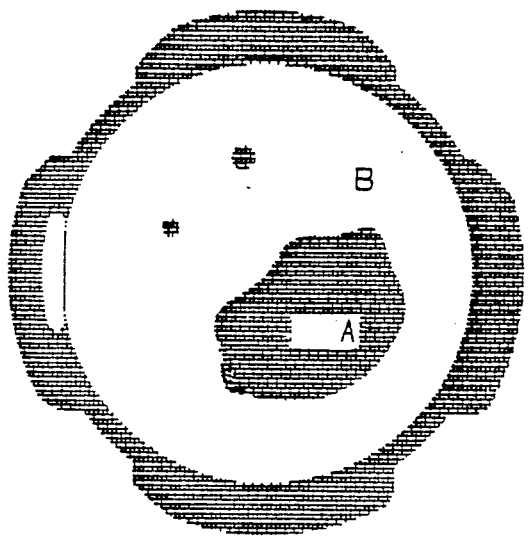
Figure 3B:
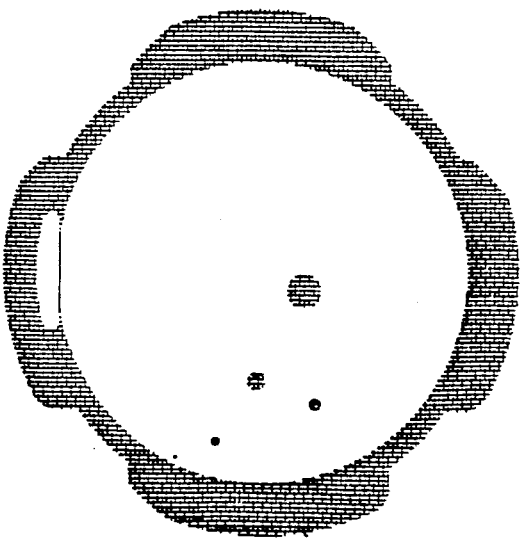

As depicted in FIG. 3A showing an ultrasonic image of the primary junction interface just after completion of the room temperature stabilization of the silicon substrates and FIG. 3B showing an ultrasonic image of the junction interface after completion of the high temperature heat-treating at 1,100° C. for 10 minutes in the wet oxygen gas atmosphere, the micro-gaps shown at the section A of FIG. 3A remaining on the interface after the primary bond are almost removed from the interface through the short time heat-treating.

FIG. 4 shows variation of the micro-gaps as a function of heat-treating atmospheric gases, the wet oxygen gas, the dry oxygen gas and the nitrogen gas. In this graph of FIG. 4, the variation of the micro-gaps is represented as a function of the heat-treating atmospheres and heat-treating time under the condition that the y-axis value 1.0 represents the maximum occupying rate of micro-gaps occupying 15 to 20% of the total area of the junction interface after the primary bond while the value 0.0 represents the minimum occupying rate of micro-gaps occupying not more than 1% of the total area of the junction interface by filling-up effect generated by the heat-treating.

As represented in the graph of FIG. 4, the micro-gaps occupying 15 to 20% of the primary junction interface are efficiently filled up in order to occupy not more than 1% of the total interface area in the case of completion of heat-treating for about 2 minutes in the wet oxygen gas atmosphere. On the contrary, the heat-treating carried out in the dry oxygen gas atmosphere or in the nitrogen gas atmosphere requires substantially longer heat-treating time of at least 60 minutes in order to accomplish the same filling-up effect of the micro-gaps as the present heat-treating using the wet oxygen gas atmosphere.

Here, the noble filling-up effect of micro-gaps in the case of heat-treating using the wet oxygen gas atmosphere arises from the intrinsic characteristic of the wet oxygen gas. Otherwise stated, the wet oxygen gas has a high solubility in the silicon oxide layer which is about 600 times as high as those of the dry oxygen gas $O_2$ and nitrogen gas $N_2$ and, in this respect, is easily fed to the micro-gaps, each having a micro-width less than about 0.1 μm, by way of the micro-channels of the junction interface in order to cause the interfacial oxide layers to be grown at the micro-gaps. Such an interfacial oxide layer growing causes the filling-up effect of the micro-gaps.

In other words, while the conventional heat-treating using the dry oxygen gas atmosphere or the nitrogen gas atmosphere intends to remove the micro-gaps of the junction interface by the elastic/plastic deformation of silicon substrates and the solid state diffusion of silicon atoms which can not occur before a predetermined time has lapsed, the noble heat-treating using the wet oxygen atmosphere according to this invention causes the interfacial oxide layer to be grown in a short time during the initial step of the heat-treating prior to the elastic/plastic deformation and the solid state diffusion in order to fill up most of the micro-gaps. The remaining part of the micro-gaps after the interfacial oxide layer growing of this invention will be efficiently removed by virtue of the typical elastic/plastic deformation of the silicon substrates and the typical solid state diffusion of silicon atoms by which the interfacial oxide layer growing is followed.

Figure 5A:
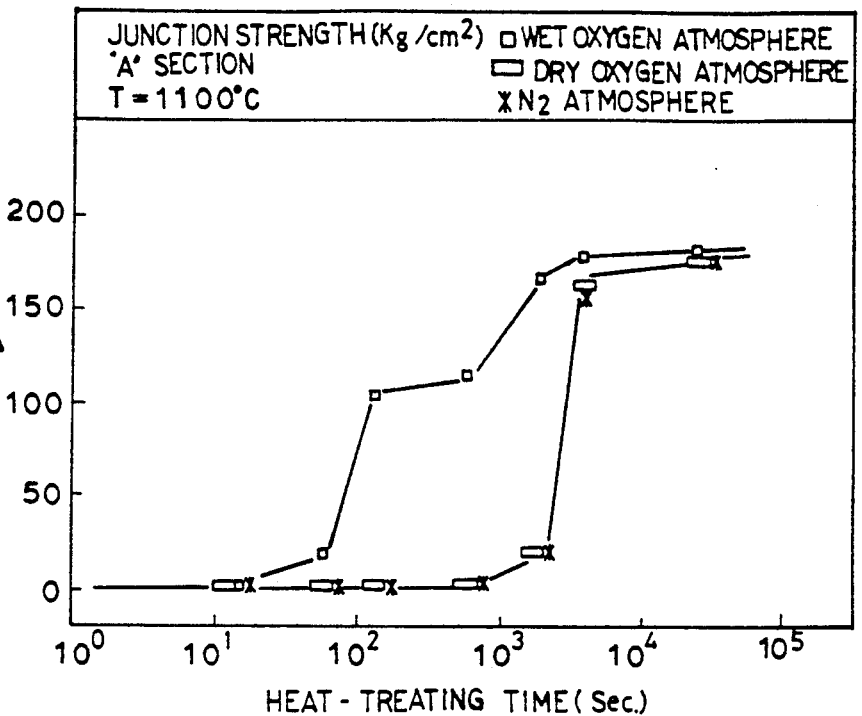
Figure 5B:
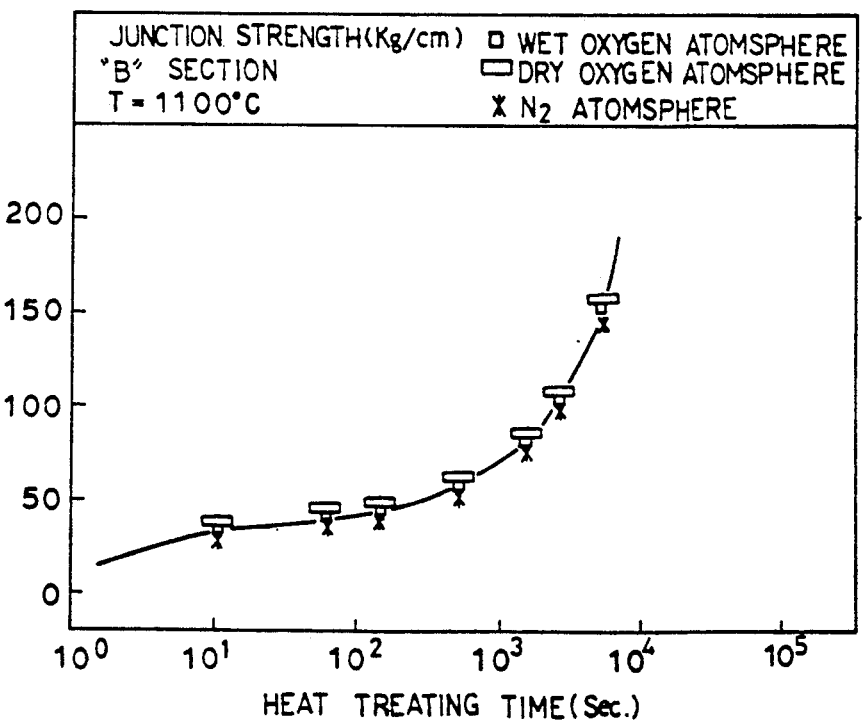

Turning to FIGS. 5A and 5B, respectively showing graphs of variation of junction strength as a function of the heating-treating atmosphere and the heat-treating time, FIG. 5B is a graph of the micro-gaps, that is, the A section of FIG. 3A, while FIG. 5B is a graph of the stable junction part, that is, the B section of FIG. 3B.

Referring first to FIG. 5A, the junction strength of the junction interface between the silicon substrates in the case of heat-treating using the wet oxygen gas atmosphere increases to about 110 kg/cm$^2$ when 2 minutes of the heat-treating time, which is equal to the required heat-treating time for reducing the occupying rate of micro-gaps to 1% of the total interface area in the wet oxygen atmosphere when referred to the graph of FIG. 4, has lapsed. Thereafter, the increase of junction strength is slowed down for a time range of about 2 to 10 minutes, so called transition time range, after accomplishment of the junction strength of about 110 kg/cm$^2$. After lapse of 10 minutes of heat-treating time, the junction strength is again steeply increased in order to reach the maximum junction strength of about 180 kg/cm$^2$ after all when 60 minutes of heat-treating time has lapsed.

Meanwhile, the junction strength of the junction interface in the case of heat-treating using the dry oxygen gas atmosphere or the nitrogen gas atmosphere is scarcely increased until 60 minutes of heat-treating time has lapsed, however, the junction strength is steeply increased to the maximum junction strength of about 180 kg/cm$^2$ after lapse of about 60 minutes.

Turning to the graph of FIG. 5B, it is noted that when the junction of the silicon substrates by the initial junction is completely accomplished with no micro-gap in the junction interface, the junction strength of the junction interface is increased in proportion to the heat-treating time regardless of the heat-treating atmospheres.

As described above, the silicon fusion bonding method and apparatus according to the present invention can remove the micro-gaps of the junction interface between the silicon substrates as well as improvement of junction strength by the room temperature stabilization of the silicon substrates and the interfacial oxide layer growing generated by heat-treating, both processes carried out in the oxidant (wet oxygen gas) atmosphere, thereby reducing the required heat-treating time for removing of the micro-gaps from the junction interface to an extent of about 1/10 to 1/20 in comparison with the conventional silicon fusion bonding method using a dry oxygen gas atmosphere or a nitrogen gas atmosphere. In result, the present invention efficiently prevents, thanking for reduction of the heat-treating time, deformation of doping profile on the silicon substrate caused by high temperature/longer time heat-treating in preparation of silicon on insulator structures used for three dimensional semiconductor elements or micro-mechanical structures used for silicon sensors and, in this respect, overcomes the disadvantage of the known silicon fusion bonding in that the deformation of the doping profile causes a process error in the continued silicon structure preparation processes, for example, thinning process using electrochemical etching stop.

The present invention has been described in detail with particular reference to preferred embodiments thereof, but it will be understood that variations and modifications can be effected within the spirit and scope of the invention.

What is claimed is:

1. A silicon fusion bonding method for silicon substrates comprising the steps of:
    stabilizing said silicon substrates, which have been processed in a pre-process comprising washing, hydrophilic layer forming and drying, in an oxidant atmosphere;
    primarily bonding said silicon substrates to each other; and
    heat-treating said primarily bonded silicon substrates at a high temperature in said oxidant atmosphere in order to remove micro-gaps from a junction interface between said silicon substrates.

2. A silicon fusion method according to claim 1, wherein said oxidant atmosphere used for both the stabilizing and heat-treating steps is a wet oxygen atmosphere.

3. A silicon fusion method according to claim 1, wherein said heat-treating step is carried out at about 1,000°–1,100° C. for 2–10 minutes.

* * * * *